United States Patent
Fischer et al.

(10) Patent No.: US 6,898,257 B2
(45) Date of Patent: May 24, 2005

(54) TRANSMITTER DEVICE HAVING A MODULATION CLOSED LOOP

(75) Inventors: Georg Fischer, Bavaria (DE); Volker Riemann, Ansbach (DE)

(73) Assignee: Lucent Technologies Inc., Murray Hill, NJ (US)

( * ) Notice: Subject to any disclaimer, the term of this patent is extended or adjusted under 35 U.S.C. 154(b) by 740 days.

(21) Appl. No.: 09/788,900

(22) Filed: Feb. 20, 2001

(65) Prior Publication Data

US 2001/0055347 A1 Dec. 27, 2001

(30) Foreign Application Priority Data

Feb. 28, 2000 (EP) ............................................ 00301545

(51) Int. Cl.[7] .............................................. H03D 3/24
(52) U.S. Cl. ....................... 375/376; 375/296; 375/297; 375/375; 455/126; 455/114.3
(58) Field of Search ................................ 375/295–298, 375/303, 308, 375, 376; 455/118–120, 114.3, 126; 332/159

(56) References Cited

U.S. PATENT DOCUMENTS

| | | | |
|---|---|---|---|
| 4,972,436 A | 11/1990 | Halim et al. ................... | 375/28 |
| 5,446,423 A | 8/1995 | Bienz et al. ................. | 332/170 |
| 5,699,383 A | * 12/1997 | Ichiyoshi ..................... | 375/297 |
| 5,825,257 A | 10/1998 | Klymyshyn et al. ......... | 332/100 |
| 5,952,895 A | 9/1999 | McCune et al. ............. | 332/128 |
| 6,018,275 A | * 1/2000 | Perrett et al. ................. | 332/127 |
| 6,236,267 B1 | * 5/2001 | Anzil .......................... | 330/149 |
| 6,396,355 B1 | * 5/2002 | Rezin .......................... | 331/18 |
| 6,526,265 B1 | * 2/2003 | Damgaard et al. .......... | 455/118 |

FOREIGN PATENT DOCUMENTS

| | | | | |
|---|---|---|---|---|
| EP | 0 538 903 A1 | 4/1993 | ............. | H03L/7/18 |
| EP | 0 731 556 A1 | 11/1996 | ............. | H03F/1/32 |

* cited by examiner

*Primary Examiner*—Phuong Phu

(57) ABSTRACT

The invention relates, inter alia, to a transmitter device, in particular for a base transceiver station in a mobile radio system, which has a digital modulator for making available a signal containing a phase information, and a modulation closed loop having a digital phase comparator operating at baseband whose first input is connected to the output of the digital modulator. In addition, a controllable oscillator is provided for generating an RF transmission signal at a controllable transmission frequency, a device which is assigned to the controllable oscillator and has the purpose of converting the RF transmission signal into a baseband signal containing a phase information. The output of the converter device is connected to a second input of the digital phase comparator.

A GSM transmitter which has such a modulation closed loop exhibits, in terms of its out-band noise and interference characteristics, significantly improved properties in comparison with a GSM transmitter which does not include a modulation loop.

14 Claims, 2 Drawing Sheets

TRANSMITTER DEVICE HAVING A MODULATION CLOSED LOOP

CROSS-REFERENCE TO RELATED APPLICATION

This application claims priority of European Patent Application No. 00301545.0, which was filed on Feb. 28, 2000.

BACKGROUND OF THE INVENTION

1. Field of the Invention

The invention relates to a transmitter device, in particular for a base transceiver station in a mobile radio network, a modulation closed loop which can be used in such a transmitter device, and a digital phase/frequency discriminator which is suitable for use in such a modulation closed loop.

2. Related Art

One of the most exacting requirements which is made of a GSM transmitter is its compliance with the GSM specifications in terms of the out-band noise and the interference of the GSM transmitter in the receiver band. The reason for this is the fact that the transmitter and receiver can be operating simultaneously and the separation between the transmitter band and the receiver band is 10 MHz at minimum. Hitherto, in order to comply with the specifications, filters were used at the output of the base stations. These filters are expensive owing to the required high level of signal coherence and steep edges, and the transmission power which can be effectively used is unnecessary owing to its insertion loss which has to be compensated again by a higher power output stage.

For this reason, the invention is based on making available a transmitter device, a modulation closed loop and a digital phase/frequency discriminator which fulfil the above mentioned GSM specifications and the requirements made of the output filter of a transmitter and reduce the costs of that transmitter.

SUMMARY OF THE INVENTION

A core idea of the invention is to feed back the RF output signal of a transmitter and to compare it with the output signal of a modulator in a phase comparator. The controlled variable which is contained in this way then directly actuates a voltage-controlled oscillator which supplies the output signal.

For this purpose, a transmitter device is provided, in particular for a base transceiver station in a mobile radio system, which transmitter device comprises a digital modulator for making available a baseband signal which contains a phase information. In addition, a modulation closed loop is implemented which has a digital phase comparator whose first input is connected to the output of the digital modulator. The modulation closed loop also contains a controllable oscillator, in particular a voltage-controlled oscillator (VCO) for generating an RF transmission signal with a controllable transmission frequency and a device which is assigned to the controllable oscillator and has the purpose of converting the RF transmission signal into a baseband signal containing a phase information. The output of the converter device is connected here to a second input of the digital phase comparator.

The advantage of a digital phase comparator consists in the fact that it compares signals in the baseband so that, in contrast to an analog phase comparator, no expensive high-speed phase comparators are required.

It is thus possible, for example, for the digital phase comparator which is used to be a digital phase/frequency discriminator which exhibits very rapid locking-in characteristics.

In order to obtain a baseband signal from the RF transmission signal, the converter device firstly has an analog/digital converter which is connected to an input of a complex digital multiplier. A controllable digital complex oscillator is connected to the other input of the complex digital multiplier. The controllable complex digital oscillator can be a numerically controlled oscillator (NCO) by means of which frequency jumps can be quickly modulated onto the RF transmission signal.

The analog/digital conversion and the downconversion of the RF transmission signal with respect to the baseband by means of the complex digital multiplier makes it possible to avoid processing the information in an intermediate frequency range, thus preventing electromagnetic faults which would occur with an analog embodiment of the modulation closed loop. Thanks to the digital downconversion of the RF signal and to the subsequent phase comparison of two baseband signals, very rapid frequency jumps, such as may be necessary in a GSM transmitter, are also permitted. The single limiting factor here is the bandwidth of the modulation closed loop itself. Consequently, when the modulation closed loop is embodied in a digital form there is no need, in contrast with an analog modulation closed loop, for expensive phase jump synthesizers, also referred to as hopping synthesizers. In addition, when the modulation closed loop is embodied in a digital form, phase errors, which would be caused by complex analog mixers and analog upconverters, are avoided.

In order to keep down the costs of the circuitry of the transmitter device, the digital signal processing of the modulation closed loop is carried out at a low clock frequency. For the same purpose, the converter device has a complex low-pass and decimating filter with which the sampling rate with which the RF transmission signal has been sampled is reduced.

Connected downstream of the low-pass and decimating filter is a demodulator which makes available the baseband signal which contains a phase information item, said signal being fed to the digital phase comparator. At this point it is to be noted that the demodulator may be embodied as a phase and amplitude demodulator.

The digital phase/frequency discriminator has a phase comparator device which compares the baseband signal, which has been made available by the demodulator, contains a phase information and has been derived from the RF signal, with the baseband signal which contains a phase information item and which is supplied by the digital modulator. A detector device for determining the degree of change (derivation) of the phase difference values supplied by the comparator device is connected to the phase comparator device.

The detector device comprises a device for eliminating phase jumps, a differentiating element, a threshold value detector and a monoflop.

In addition, a switch is provided which switches the phase/frequency discriminator into the frequency tracking mode or into the phase tracking mode as a function of the degree of change which is determined. In the phase tracking mode, a device for eliminating phase jumps is connected between the phase comparator device and the output of the phase/frequency discriminator.

In order to be able to feed an analog control signal to the controllable oscillator, a digital/analog converter is connected between the output of the phase/frequency discriminator and the controllable oscillator and is followed by a loop filter.

The digital modulator is, for example, a GMSK (Gaussian minimum shift keying) modulator or an 8-PSK-modulator.

In order to be able to compensate not only phase differences in the baseband signals to be compared but also amplitude differences, the digital modulator supplies at its outputs both a phase information and an amplitude information. In a similar way, the demodulator can supply a phase information and amplitude information at its outputs. For this purpose the modulation closed loop has a controllable amplifier which is connected downstream of the controllable oscillator, and a device which is connected to the adjustable amplifier and has the purpose of comparing the amplitude information contained in the two baseband signals.

This is for modulation methods (e.g. 8-PSK) which also modulate the amplitude of the transmission signal.

In order to be able to linearize the transmitter device using a single closed loop and to be able to compensate non-linear effects such as an AM/AM conversion and an AM/PM conversion, at least a controllable amplifier and/or power amplifier are also arranged within the modulation closed loop. Otherwise, the controllable power amplifiers would have to be integrated into a separate linearization loop which contains power detectors and controllers for adjusting the amplification factor.

BRIEF DESCRIPTION OF THE DRAWINGS

The invention is explained in more detail below with reference to an exemplary embodiment in conjunction with the appended drawings, in which.

DETAILED DESCRIPTION OF THE PREFERRED EMBODIMENT

Figure 1:
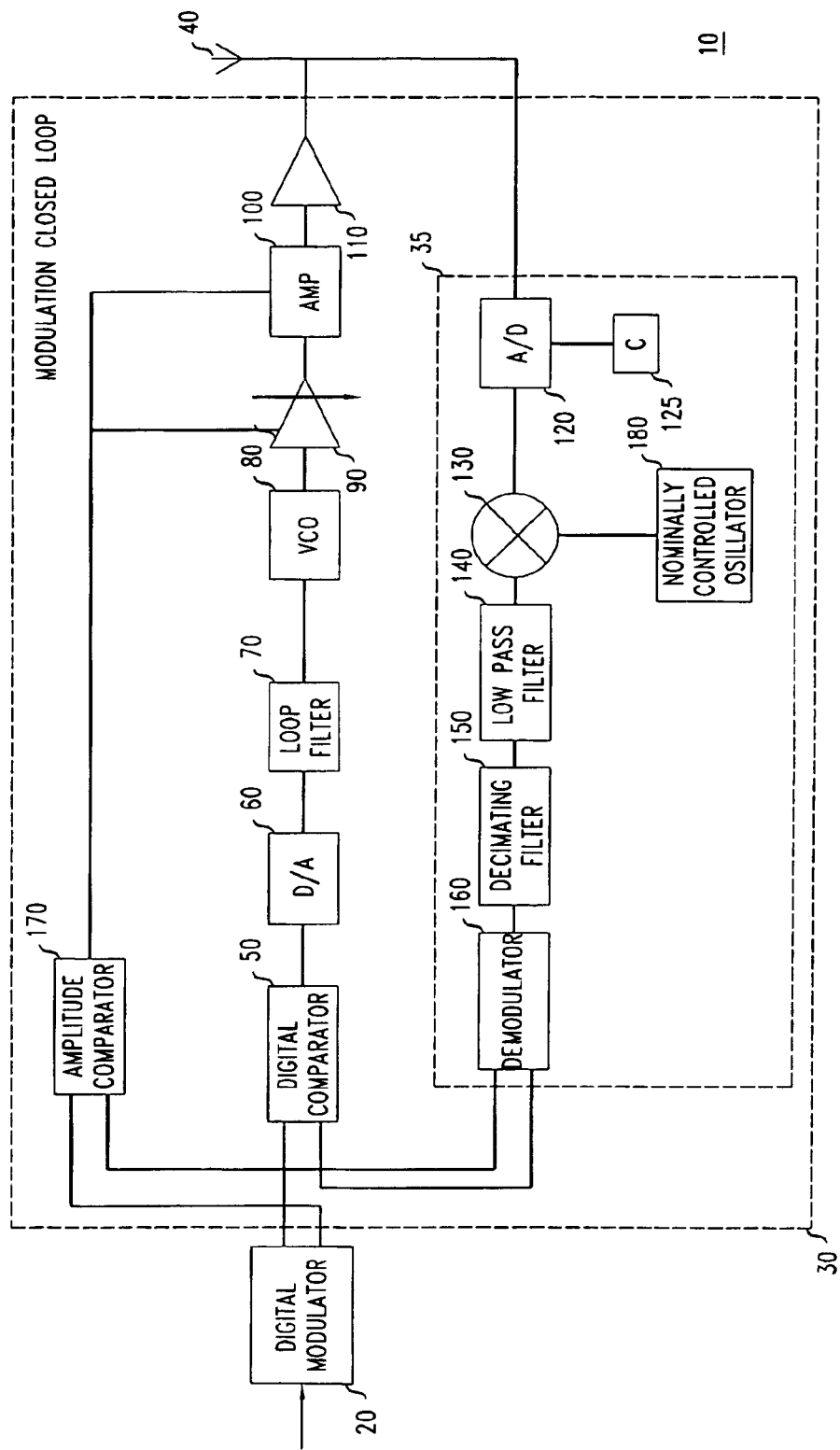
FIG. 1 shows a GSM transmitter with a digital modulation closed loop.

FIG. 1 shows a schematic block circuit diagram of an exemplary GSM (Global System for Mobile Communication) transmitter 10, which contains three essential functional blocks: a digital modulator 20, which may be embodied for example as 8-PSK modulator, a modulation closed loop 30, part of whose operations are digital, and a transmission antenna 40.

The modulation closed loop 30 has the function of mapping the digital input data stream supplied by the digital 8-PSK modulator 20 onto a high-precision 8-PSK-modulated RF signal which is broadcast by the transmission antenna 40. For this purpose, the modulation closed loop 30 has at the input end a digital phase comparator 50 which is preferably embodied as a phase/frequency discriminator. The design of the circuitry and the method of operation of the digital phase/frequency discriminator 50 are explained in more detail below with reference to FIG. 2. First, it is to be noted that the phase/frequency discriminator 50 can be operated in a frequency comparison mode and in a phase comparison mode.

The output of the digital modulator 20 at which the digital input data stream which contains a phase information in the baseband is present is connected to an input of the digital phase/frequency discriminator 50. At the output end, the digital phase/frequency discriminator 50 is connected to a digital/analog converter 60 which is in turn connected at the output end and to the input of a voltage-controlled oscillator 80, referred to as VCO for short, via a loop filter 70 which is known per se. The output of the VCO 80 can be connected to a controllable amplifier 90 which can be in turn connected to an amplifier 100, which has discrete gain settings, and an output amplifier 110. An amplified output signal is conducted to the input of the transmission antenna 40 via the output of the output amplifier 110. The output signal of the output amplifier 110, which signal corresponds to the 8-PSK-modulated RF signal of the voltage-controlled oscillator 80, is downconverted into a baseband signal containing a phase information and amplitude information by means of a feedback circuit 35, and is fed back to the second input phase/frequency discriminator 50. For this purpose, the feedback circuit 35 has firstly an analog/digital converter 120 which converts the 8-PSK-modulated RF signal into a digital signal, the sampling rate being defined by a clock signal transmitter 125 which is connected to the analog/digital converter 120. The digitized 8-PSK-modulated RF signal is then applied to the first input of a complex digital multiplier 130 which downconverts the digitized 8-PSK-modulated RF transmission signal into a baseband signal. For this purpose, the second input of the complex digital multiplier 130 is connected to a numerically controlled oscillator 180 which supplies a complex output signal. The numerically controlled oscillator 180 can also be used to modulate frequency jumps, as is customary in mobile radio, onto the RF transmission signal which is to be broadcast. The transmission signal which is now present as a baseband signal then passes through a complex digital low-pass filter 140, a decimating filter 150, in which the sampling rate for the baseband signal is reduced further, and then arrives at the input of a demodulator 160, which is a phase and amplitude demodulator in the present example. The demodulator 160 makes available at its output a baseband signal which contains a phase information item and an amplitude information item and which is applied, inter alia, to the second input of the phase/frequency discriminator 50. In addition, the modulation closed loop 30 has an amplitude comparator 170 which compares the amplitude information of the baseband signal made available by the digital modulator 20 with the amplitude information of the baseband signal made available by the phase demodulator 160. The output signal of the amplitude comparator 170 is applied as a control signal to the controllable amplifier 90.

The fact that the controllable amplifier 90, the incrementally controllable amplifier 100 and the output amplifier 110 are situated within the modulation closed loop 30 permits the entire 8-PSK transmitter 10 to be linearized. It is not necessary to linearize the amplifiers 90 to 110 using a separate control loop.

The method of operation of the GSM transmitter 10 will be explained below in more detail.

The 8-PSK-modulated RF signal is fed from the output of the output amplifier 110 to the A/D converter 120 to which the clock signal transmitter 125 applies a frequency clock which leads to undersampling of the 8-PSK-modulated RF signal. The undersampling results in the spectrum of the RF signal continuing periodically so that the useful signal spectrum ultimately lies in the first Nyquist zone. The sampled signal is then quantized and multiplied by the output signal of the numerically controlled oscillator 180 in the complex digital multiplier 130. The numerically controlled oscillator 180 supplies a complex-valued signal which is ideally composed of a single spectral line. The frequency at which the spectral line of the numerically controlled oscillator 180 lies is used as a parameter for the setting of the transmitter output frequency of the GSM transmitter 10. The multiplication of the output signal of the numerically controlled oscillator 180 by the sampled 8-PSK-modulated RF signal brings about a downconversion into the baseband. The digital downconversion of the RF signal, which has taken place in the complex digital multiplier 130, to form a baseband signal permits virtually any desired rapid frequency jumps which are fed via the numerically controlled oscillator 180 to the multiplier 130 and are thus modulated onto the baseband signal. In contrast to an analog implementation of the modulation closed loop 30, no hopping synthesizer is required, a significant cost saving can be achieved in this way. The baseband signal is then low-pass filtered in the low-pass filter 140, and the sampling rate is further reduced in the decimating filter 150. In the demodulator 160, a format conversion of the baseband signal from a complex-valued representation into a polar form representation is, for example, carried out so that the instantaneous actual phase can be tapped at the demodulator 160 and fed to the digital phase/frequency discriminator 50. It is to be noted that the actual phase which is present at the demodulator 160 is present, in contrast to analog modulation control loops, as a baseband signal. For this reason, it is not necessary to convert the RF signal back to an intermediate frequency which would be necessary in analog modulation closed loops. In this way, EMC problems can also be avoided. The actual phase of the baseband signal which is present at the output of the demodulator 160 and which corresponds to the converted 8-PSK-modulated RF signal is applied to the one input of the digital phase control frequency discriminator 50. The reference phase which is made available at the output of the digital modulator 20 is fed to the other input of the digital phase/frequency discriminator 50. The digital phase/frequency discriminator 50 is thus capable of comparing two baseband signals in terms of their phase angle.

In the phase/frequency discriminator 50, first a difference signal is determined from the reference phase of the 8-PSK-modulated signal, which is made available by the digital modulator 20, and the actual phase, which is made available by the demodulator 160. In the event of the signal supplied by the digital modulator 20 being unmodulated, just one constant phase, which may be any one which is desired, is present at the reference phase input of the digital modulator 20. The phase information item of the actual signal is present at the actual input of the phase/frequency discriminator 50. The demodulator 160 usually only supplies phase values between −180° and +180°. If the actual signal is then modulated around 180°, phase jumps of between +180° and −180°, and vice versa, may occur at the actual input of the phase/frequency discriminator 50. This leads to a situation in which the modulation closed loop 30 can drop its lock, in particular in the phase comparison mode, if the transmitter centre frequency is already compensated. It is to be noted at this point that the time at which the phase/frequency discriminator 50 is switched over from the frequency comparison mode into the phase comparison mode is critical. The switching over expediently takes place at an early time at which the difference signal would be zero. If the phase/frequency discriminator 50 were to be switched over immediately when the desired transmission frequency is reached without taking into account the current phase difference, the modulation closed loop 30 would take significantly longer firstly to compensate any relatively large phase shifts before minor phase shifts owing to modulation operations could then be compensated. The digital output signal of the phase/frequency discriminator 50 is then fed to the digital/analog converter 60 and to the loop filter 70, which makes available the control signal for the VCO 80 which operates as a frequency modulator. The output signal of the VCO 80, which is the 8-PSK-modulated RF transmission signal, then runs through the amplifiers 90, 100 and 110 before it is broadcast via the transmission antenna 40.

Figure 2:
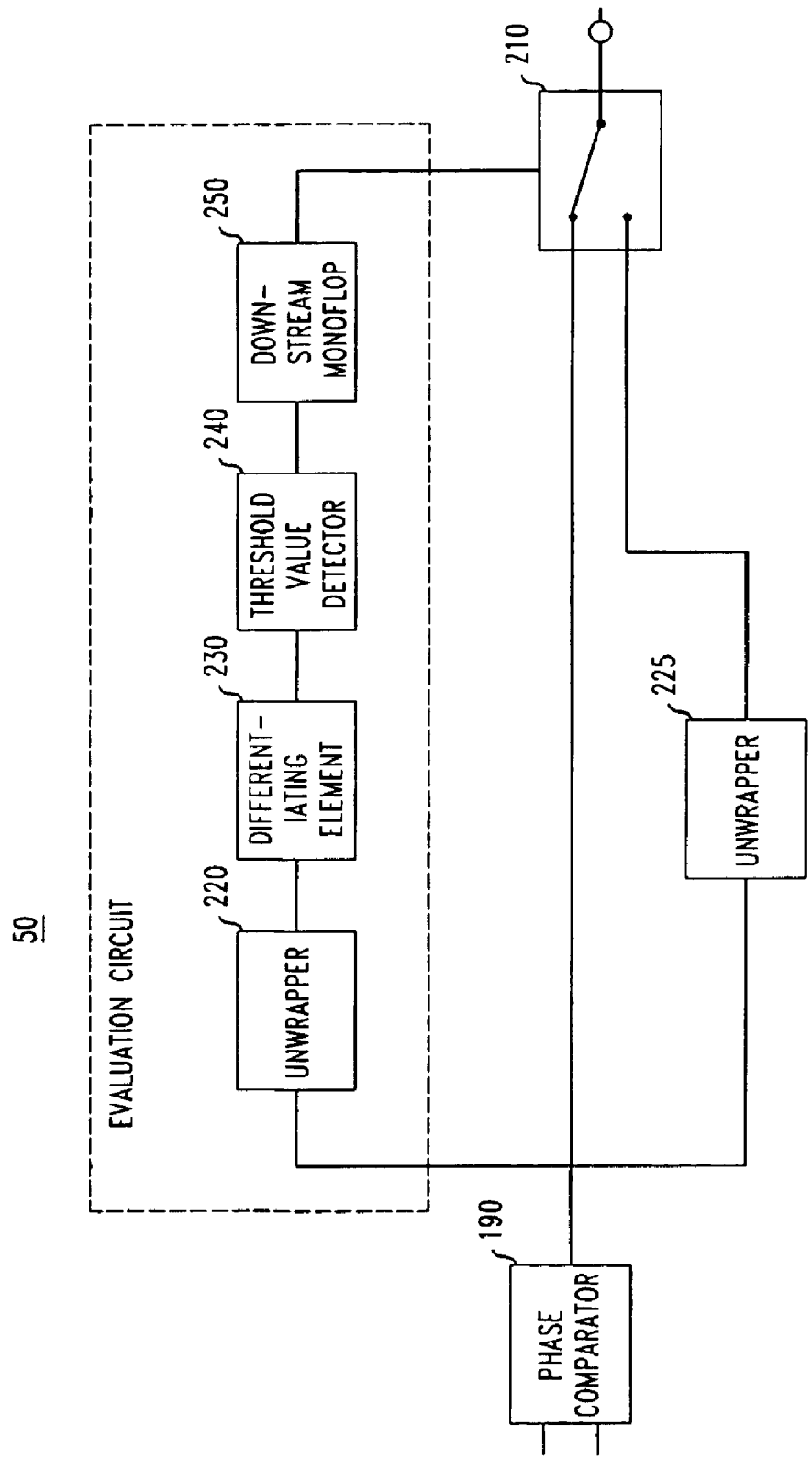
FIG. 2 shows a more detailed block circuit diagram of the phase/frequency discriminator used in FIG. 1.

The phase/frequency discriminator is represented in more detail in FIG. 2.

The phase/frequency discriminator 50 is distinguished by the fact that it operates in two operating modes, to be precise in the frequency comparison mode, in which rough control errors concerning the centre frequency can be compensated very quickly, and in a slower, but very precise, phase comparison mode which has the purpose of compensating minor changes owing to modulation. In the frequency comparison mode, the voltage-controlled oscillator 80 is quickly corrected to the desired transmission frequency. A rapid correction of shifts in the transmission frequency is desirable in particular if the GSM transmitter 10 is intended to transmit at different frequencies from one time slot to the next. The time which this requires can be in the order of the magnitude of 10 to 30 microseconds in GSM arrangements.

As is shown in FIG. 2, the phase/frequency discriminator 50 has a phase comparator device 190 at the input end. The output of the phase comparator device 190 is connected to an evaluation circuit 200 which is connected at the output end to a switch 210 which switches the phase/frequency discriminator 50 into the frequency tracking mode or into the phase tracking mode. The evaluation circuit 200 has an unwrapper 220 which can eliminate phase jumps in the baseband signal which may occur owing to the finite numerical values during the digital processing in the phase comparator device 190. Connected downstream of the unwrapper 220 is a differentiating element 230 which determines the derivation of the phase difference so that it is able, in conjunction with a threshold value detector 240, to detect when a frequency shift is exceeded. A downstream monoflop 250 switches the switch 210 into the frequency comparison mode or into the phase comparison mode for a predetermined time, and specifically as a function of the phase frequency shift determined by the threshold value detector 240. As FIG. 2 also shows, the branch of the phase comparison mode also contains an unwrapper 225, whereas in the frequency comparison mode the output of the phase comparison device 190 is connected directly to the switch 210, and thus forms the output of the phase/frequency discriminator 50.

The method of operation of the digital phase/frequency discriminator 50 will be described in more detail below.

While the modulation closed loop 30 is being set to a new transmission frequency, the phase/frequency discriminator 50 is in the frequency comparison mode. In this state, the phase/frequency discriminator 50 brings about a correction of the transmitter centre frequency, whereas in the phase comparison mode the transmission centre frequency is corrected, and the modulation closed loop 30 is therefore also essentially locked in, but minor phase or frequency shifts owing to the modulation have to be compensated. Since the necessary detuning of the voltage-controlled oscillator 80 owing to the modulation is usually slight, a relatively low tracking speed of the modulation control loop 30 is sufficient, in contrast to a high tracking speed in the frequency comparison mode. In order to be able to set the tracking speed appropriately, a higher loop amplification must be selected in the frequency comparison mode. Thanks to the transmitter 10 described above, with a modulation closed loop 30 which operates in an essentially digital fashion, the characteristic curve of the voltage-controlled oscillator is linearized. This circuit arrangement also has the effect that the 8-PSK-modulated RF signal of the modulation closed loop 30 has a particularly low wideband noise, which is mainly determined by the quality of the voltage-controlled oscillator 80.

Thanks to the modulation closed loop 30 which is essentially embodied in digital form, the phase comparison is carried out between the 8-PSK-modulated RF signal which has been converted and fed back and the output signal of the digital modulator 20 in the baseband. This makes it possible to avoid the need for circuit components which would normally have to operate in the intermediate frequency range, which significantly reduces the cost of such a circuit arrangement in comparison with a modulator closed loop which is embodied in analog form. In particular, the GSM transmitter 10 has significantly improved characteristics in terms of its out-band noise and interference properties in comparison with GSM transmitters which operate without feedback of the 8-PSK-modulated RF signal.

Key to Reference Numbers
20 Digital modulator
30 Modulation closed loop
35 Feedback circuit (conversion device)
40 Transmission antenna
50 Digital phase/frequency discriminator
60 D/A converter
70 Loop filter
80 VCO
90 Controllable amplifier
100 Incrementally controllable amplifier
110 Power amplifier
120 A/D converter
125 Clock signal transmitter
130 Complex digital multiplier
140 Low-pass filter
150 Decimating filter
160 Demodulator
170 Amplitude comparator
180 Complex oscillator, such as an NCO
190 Phase comparator device
200 Evaluation circuit
210 Switch
220, 225 Unwrapper
230 Differentiating element
240 Threshold value detector
250 Monoflop While this invention has been particularly shown and described with reference to several preferred embodiments thereof, it will be understood by those skilled in the art that various changes in form and details may be made therein without departing from the scope and spirit of the invention as defined in the appended claims.

What is claimed is:

1. Transmitter device, in particular for a base transceiver station in a mobile radio system, comprising
    a digital modulator for making available a baseband signal which contains a phase information and
    a modulation closed loop having a digital phase comparator whose first input is connected to the output of the digital modulator,
    a controllable oscillator for generating an RF transmission signal with a controllable transmission frequency, a device which is assigned to the controllable oscillator and has the purpose of converting the RF transmission signal into a baseband signal which contains a phase information,
    the output of the converter device being connected to a second input of the digital phase comparator, wherein the converter device has an analog/digital converter which is connected to an input of a complex digital multiplier, a controllable digital complex oscillator being connected to the other input of the complex digital multiplier.

2. Transmitter device according to claim 1, wherein the digital phase comparator is a digital phase/frequency discriminator.

3. Transmitter device according to claim 1, wherein in the converter device the output of the complex digital multiplier is connected via a complex low-pass and decimating filter to a demodulator for making available a baseband signal which contains a phase information.

4. Transmitter device according to claim 3, wherein the digital phase/frequency discriminator has the following features:
    a phase comparator device for comparing the two baseband signals which each contain a phase information,
    a detector device, connected to the phase comparator device, for determining the degree of change in the phase difference values supplied by the phase comparator device, and a
    switch which switches the phase/frequency discriminator into the frequency tracking mode or into the phase tracking mode as a function of the degree of change which is determined.

5. Transmitter device according to claim 4, wherein the detector device contains a device for eliminating phase jumps, a differentiating element a threshold value detector and a monoflop, a device for eliminating phase jumps being connected between the phase comparator device and the output of the phase/frequency discriminator in phase tracking mode.

6. Transmitter device according to claim 5, wherein a digital/analog converter and a loop filter are connected between the phase/frequency discriminator and the controllable oscillator.

7. Transmitter device according to one of claim 6, wherein the digital modulator is a GMSK modulator or a 8-PSK-modulator.

8. Transmitter device according to claim 7, wherein the controllable oscillator is a voltage-controlled oscillator and the controllable complex digital oscillator is a numerically controlled oscillator.

9. Transmitter device according to claim 8, wherein the digital modulator supplies a baseband signal containing a phase and amplitude information, in that the demodulator supplies a baseband signal containing a phase and amplitude information, and in that the modulation closed loop has an adjustable amplifier connected downstream of the controllable oscillator, and comparator which is connected to the adjustable amplifier for comparing amplitude information contained in the two baseband signals.

10. Modulation closed loop, in particular for a transmitter device according to claim 9, characterized by a digital phase/frequency discriminator having two inputs for applying in each case one baseband signal containing a phase information, a controllable oscillator for generating an RF output signal with controllable frequency, a device which is assigned to the controllable oscillator and has the purpose of converting the RF output signal into a baseband signal containing a phase information item, the output of the converter device being connected to one of the inputs of the digital phase/frequency discriminator, wherein the converter device has an analog/digital converter which is connected to an input of a complex digital multiplier, a controllable digital complex oscillator being connected to the other input of the complex digital multiplier.

11. Modulation closed loop according to claim 10, further characterized by an analog/digital converter, connected via a complex low-pass and decimating filter to a demodulator for generating a baseband signal containing a phase information.

12. Digital phase-frequency discriminator, in particular for use in a modulation closed loop according to claim 10, comprising
 a device for comparing two baseband signals which each contain a phase information,
 a detector device which is connected to the phase comparator device and has the purpose of determining the degree of change of the phase difference values supplied by the phase comparator device,
 and a switch which switches, as a function of the degree of change which is determined, the phase/frequency discriminator into the frequency tracking mode or into the phase tracking mode.

13. Digital phase/frequency discriminator according to claim 11, wherein the detector device contains a device for eliminating phase jumps, connected via a differentiating element and a threshold value detector to a monoflop.

14. Digital phase/frequency discriminator according to claim 11 or 12, wherein a device for eliminating phase jumps is switched between the phase comparator device and the output of the phase/frequency discriminator in the phase tracking mode.

* * * * *